United States Patent
Stief

(10) Patent No.: US 7,327,766 B2
(45) Date of Patent: Feb. 5, 2008

(54) CIRCUIT CONFIGURATION FOR RECEIVING A DATA SIGNAL

(75) Inventor: Reidar Stief, München (DE)

(73) Assignee: Infineon Technologies AG, Munich (DE)

( * ) Notice: Subject to any disclaimer, the term of this patent is extended or adjusted under 35 U.S.C. 154(b) by 1027 days.

(21) Appl. No.: 10/247,577

(22) Filed: Sep. 19, 2002

(65) Prior Publication Data

US 2003/0053471 A1    Mar. 20, 2003

(30) Foreign Application Priority Data

Sep. 19, 2001   (DE)   ............................ 101 46 149

(51) Int. Cl.
*H04J 3/02* (2006.01)
(52) U.S. Cl. .................. 370/537; 365/189.02; 711/105
(58) Field of Classification Search ................ 370/540, 370/542
See application file for complete search history.

(56) References Cited

U.S. PATENT DOCUMENTS

| | | | | |
|---|---|---|---|---|
| 6,128,233 A * | 10/2000 | Yu et al. | ................. | 365/189.02 |
| 6,128,700 A * | 10/2000 | Hsu et al. | .................... | 711/122 |
| 6,188,638 B1 | 2/2001 | Kuhne | | |
| 6,442,645 B1 * | 8/2002 | Freker | ......................... | 711/105 |
| 6,453,381 B1 * | 9/2002 | Yuan et al. | .................. | 711/105 |
| 6,529,993 B1 * | 3/2003 | Rogers et al. | ............... | 711/105 |
| 6,742,098 B1 * | 5/2004 | Halbert et al. | ............... | 711/172 |
| 6,971,039 B2 * | 11/2005 | Krause et al. | ............... | 713/400 |
| 7,002,378 B2 * | 2/2006 | Srikanth et al. | ............... | 327/50 |
| 7,061,941 B1 * | 6/2006 | Zheng | ......................... | 370/535 |
| 2001/0015927 A1 * | 8/2001 | Ooishi | ........................ | 365/201 |
| 2005/0237851 A1 * | 10/2005 | Ware et al. | .................. | 365/233 |

FOREIGN PATENT DOCUMENTS

DE    198 39 105 A1    3/2000

OTHER PUBLICATIONS

Author not listed: "DDR SDRAM Functionality and Controller Read Data Capture", Micron Technology, vol. 8, Issue 3, pp. 1-13.

\* cited by examiner

*Primary Examiner*—Chi Pham
*Assistant Examiner*—Kevin Mew
(74) *Attorney, Agent, or Firm*—Laurence A. Greenberg; Werner H. Stemer; Ralph E. Locher

(57) ABSTRACT

In a clock-synchronously operated semiconductor memory, particularly a DDR SDRAM, data are read in clock-synchronously with respect to a data strobe signal in the normal mode, according to standard. During the test mode, a DQ receiver is supplied with the operating clock signal instead of the DQS signal. A downstream memory element is bridged by a direct signal path. To change over, multiplexers/demultiplexers driven by the test mode control signal are provided. The data signal supplied to the memory cell array is available immediately after a write command has been applied to the memory cell array.

7 Claims, 2 Drawing Sheets

CIRCUIT CONFIGURATION FOR RECEIVING A DATA SIGNAL

BACKGROUND OF THE INVENTION

Field of the Invention

The invention relates to a circuit configuration for receiving a data signal. The circuit has a first connection for receiving the data signal and a second connection for receiving a first clock signal, and also an input buffer connected downstream of the first connection.

In integrated semiconductor circuits that operate clock-synchronously, data signals need to be received in synchronicity with the reception clock. In the case of clock-synchronously operated semiconductor memories, so-called SDRAMs (Synchronous Dynamic Random Access Memories), particularly those operating on the basis of the double data rate principle (DDR), a standardization based on JEDEC provides a data signal DQS with respect to which the data signals on the semiconductor memory's input buffer are assessed clock-synchronously. The data signal is valid during the rising and falling edges of the DQS signal. To provide the chip with sufficient time to evaluate the DQS signal and hence to receive and process further, in particular to buffer-store or latch, the data during normal operation, a time period tDQSS has been provided. When the DDR SDRAM is notified of a write command for receiving data which are to be stored in the memory cells, the time tDQSS must elapse before the data can finally be validly applied to the input connections of the semiconductor memory.

FIG. 3 shows a timing diagram for a conventional type prior art DDR SDRAM. In addition, reference is had to *Design Line,* a publication of Micron Technology, Inc., vol. 8, 3rd ed., third quarter 1999, entitled "DDR SDRAM Functionality and Controller Read Data Capture." The operating cycles in the semiconductor memory are controlled on the basis of the clock signal CLK. A read command 33 in the command signal CMD is evaluated on a rising edge 30 of the operating clock signal CLK. The DQS signal described above has the first rising edge on an edge 31 which is delayed by one operating clock cycle. Only now can data values DQ be read in on the rising and falling edges of the DQS signal. The data values are put together within the circuit to form a longer word length and are forwarded to a data line which is connected to secondary sense amplifiers serving the memory cell array. These data DRWDL are finally available in valid form with a delay of one further clock period of the operating clock signal CLK, on the next rising edge 32, on the secondary sense amplifier at the input of the memory cell array. This operating cycle needs to be observed according to the standard stipulation for DDR SDRAMs. Between the sending of a write command 33 in the command signal CMD and the application of the first data value 34, the delay time tDQSS of at least one clock period thus elapses; at least two clock periods 35 elapse before a data word 36 can be applied to the memory cell array via the signal DRWDL.

Particularly in the test mode of the semiconductor memory, it is necessary for data to be written to the entire memory cell array sequentially. In that case, the semiconductor memory is conventionally tested under various operating conditions. To this end, prescribed data values are written to all the memory cells in the memory cell array and are then read again in order for them to be compared with the prescribed data values. An error is deleted if the read data value differs from the written data value. Since, when writing to relatively large parts of the memory cell array or to the entire memory cell array, it is very often necessary to wait repeatedly for the delay time tDQSS prescribed according to standard, a considerable operating delay arises.

SUMMARY OF THE INVENTION

It is accordingly an object of the invention to provide a circuit configuration, which overcomes the above-mentioned disadvantages of the heretofore-known devices and methods of this general type and which specifies a circuit configuration in which, on the one hand, specifications prescribed according to the applicable standard are observed when reading in data values, but on the other hand accelerated reading in of data values is permitted on a switchable basis. One specific object of the invention is to specify, particularly for semiconductor memories of the DDR SDRAM type, a way of accelerating the reading in which is suitable for the test case.

With the foregoing and other objects in view there is provided, in accordance with the invention, a circuit configuration for receiving a data signal, comprising:

a first connection for receiving the data signal;

a second connection for receiving a first clock signal;

an input buffer connected downstream of the first connection in a signal flow direction;

a clock-controllable memory element connected downstream of the input buffer;

an output connection connected downstream of the memory element and carrying the data signal;

a first multiplexer connected to the input buffer, the first multiplexer selectively supplying the first clock signal, in a first setting, and a second clock signal, in a second setting, to the input buffer for clock control; and a switchable signal path connected to bypass the memory element when the first multiplexer is in the second setting, wherein the output connection is coupled to an output of the switchable signal path.

In accordance with an added feature of the invention, the switchable signal path comprises a demultiplexer having an input connected to an output of the input buffer and an output connected to the memory element, and a further multiplexer having an input connected firstly to the memory element and secondly to an output of the demultiplexer.

In accordance with an additional feature of the invention, the first multiplexer, the further multiplexer, and the demultiplexer are each controllable by the same control signal.

In accordance with another feature of the invention, a further input connection is provided, via which the second clock signal is input.

In accordance with a further feature of the invention, circuit means are provided for generating a rising edge of the first clock signal with a delay of at least one clock period of the second clock signal after a rising edge of the second clock signal when a read command is produced during the rising edge of the second clock signal.

In accordance with again an added feature of the invention, a memory cell array with memory cells is provided for storing data values, and the output connection is coupled to the memory cell array for receiving data values.

In accordance with a concomitant feature of the invention, the circuit configuration has a normal mode and a test mode. A function test can be carried out during the test mode, and the control signal is used for setting the test mode.

In the circuit configuration based on the invention, the waiting for the delay time tDQSS is turned off in an operating state which can be set by the control signal, for example the test mode. Instead, a supplied data value is read in in parallel with the application of the write command on the same edge of the operating clock signal. At most, it is necessary for the operating clock signal not to be chosen to be too high, so that the synchronous mode of operation can be observed.

Thus, the input-side data buffer, which is cyclically controlled by the DQS signal in the normal mode, is controlled directly by the operating clock signal CLK in the inventive test mode. Since the operating clock signal CLK is present continuously and permanently, an applied data value DQ can immediately be detected upon the next rising edge of the operating clock signal CLK. Furthermore, an additionally provided data memory, which is enabled by a dedicated control signal in the normal mode, is bridged in the inventive test mode. To this end, demultiplexers and multiplexers arranged on the input and output sides of the data memory are provided. All the changeover switches or multiplexers/demultiplexers are driven collectively by the-control signal which sets the test mode. The output of the circuit configuration is coupled to the various segments of the memory cell array, possibly with the interposition of additional logic that reorganizes data values.

The additional, relatively low circuit complexity firstly ensures a standard-based operating response and the observance of standard-based specifications. Secondly, the test mode, which is accessible only to the manufacturer of the semiconductor memory, but not to the user, can be accelerated significantly in terms of the reading in of data values.

Other features which are considered as characteristic for the invention are set forth in the appended claims.

Although the invention is illustrated and described herein as embodied in a circuit configuration for receiving a data signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
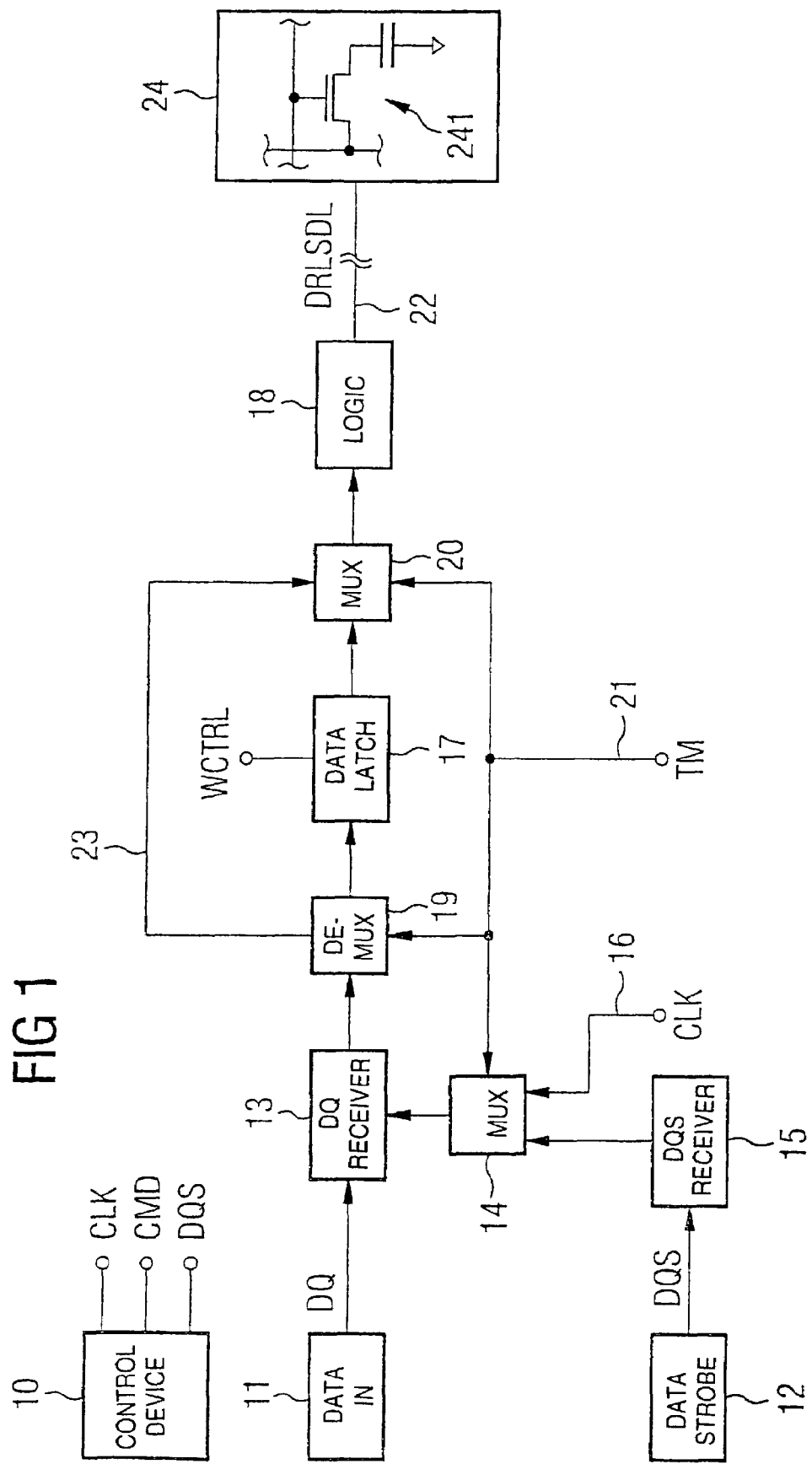
FIG. 1 is a block diagram of a circuit configuration according to the invention.
Figure 3:
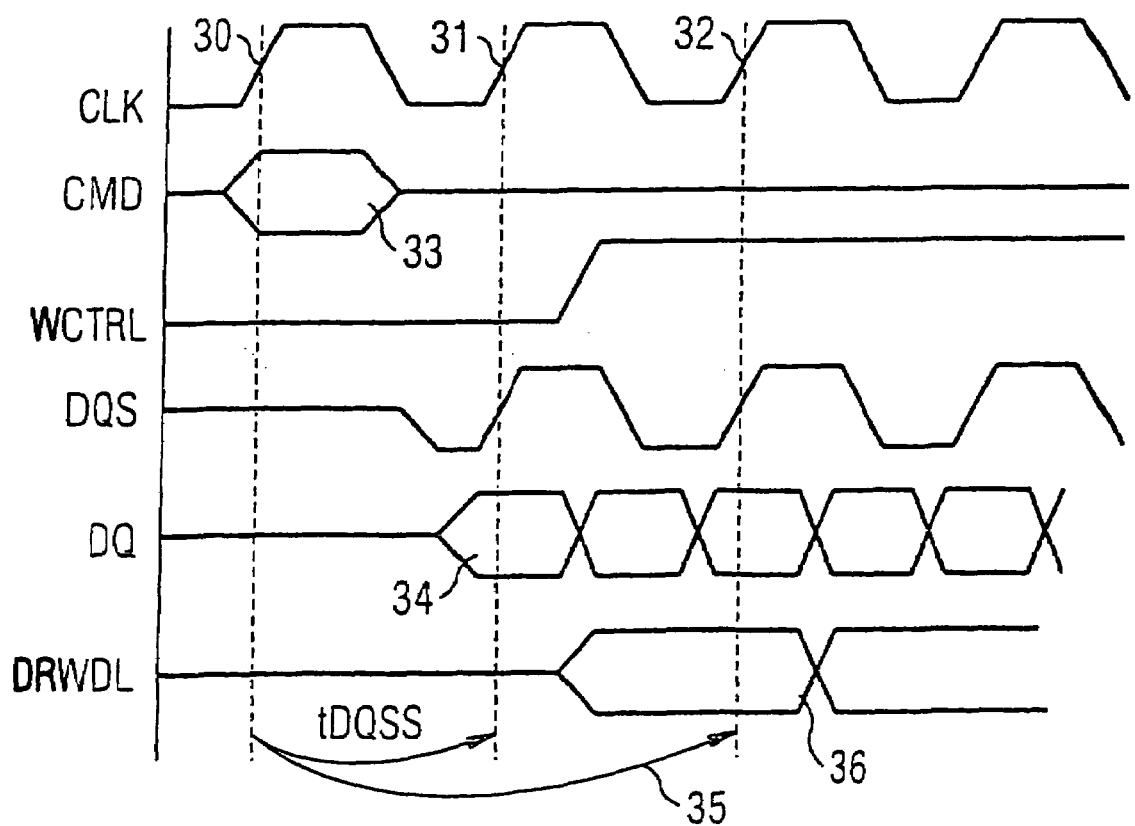
FIG. 3 is a signal diagram for signals occurring in the circuit of FIG. 1 during the normal mode, as already explained in the above introduction.

Referring now to the figures of the drawing in detail and first, particularly, to FIG. 1 thereof, there is shown a connection 11 for supplying data signals. By way of example, the connection 11 is a metalized terminal area on the surface of the semiconductor chip, a "pad". The connection 12 is the connection pad for the DQS (data strobe) signal. A data bit which is input via the DQ pad 11 is buffer-stored in an input buffer circuit or a DQ receiver 13. The clock connection of the DQ receiver 13 is driven by the DQS signal which is input via the DQS pad 12. To receive the DQS signal, the DQS pad 12 has a DQS receiver 15 connected downstream of it. A memory element 17 is connected downstream of the DQ receiver 13 and is used for further buffer storage of the received data signal. The data latch 17 is enabled by a control signal WCTRL (FIG. 3). Finally, a logic circuit 18 provides for the splitting of the received data values over various chip segments. The output connection 22, finally, is routed to the memory cell array 24 and is connected to the secondary sense amplifiers there, for example. The secondary sense amplifiers are connected via common lines to primary sense amplifiers which, for their part, again drive the bit lines to which the memory cells 241 are connected. A control device 10, for example an off-chip memory controller, provides the operating clock signal CLK, supplies operating commands CMD covering a plurality of data signal lines, for example write or read or refresh or a command for changing over to the test mode, and finally supplies the DQS signal which is input on the DQS pad 12. To this extent, the described circuit in FIG. 1 corresponds to a conventional input circuit for data signals which is arranged in a DDR SDRAM.

In accordance with the invention, a multiplexer 14 is provided and also a demultiplexer 19 and a further multiplexer 20 suitably incorporated into the signal path and being appropriately driven by one or-more test mode signals TM. The input side of the first multiplexer 14 is firstly connected to the DQS receiver 15 and is secondly connected to a connection 16 at which the operating clock signal CLK is supplied. The output side of the multiplexer 14 drives the clock input of the DQ receiver 13. The input side of the demultiplexer 19 is connected to the output of the DQ receiver 13. The output side of the demultiplexer 19 is connected to the data latch 17. The input side of the multiplexer 20 is firstly connected to the output of the data latch 17. Secondly, the input side of the multiplexer 20 is connected to the other output of the demultiplexer 19. Finally, the output side of the multiplexer 20 drives the logic device 18. All the control connections of the multiplexers/demultiplexers 14, 19, 20 are driven by the control signal TM, indicating the test mode, on the connection 21. It goes without saying that different control signals can also be used.

To drive the multiplexers/demultiplexers 14, 19, 20, it is alternatively possible to use respectively different control signals. Thus, the multiplexers/demultiplexers can be switched by different test mode control signals. It is at least necessary to observe the condition that, during the execution of a write command, the multiplexer 14 is in that setting for which the clock signal on the connection 16 is applied to the D2 receiver, and the bypass 23 is activated.

Figure 2:
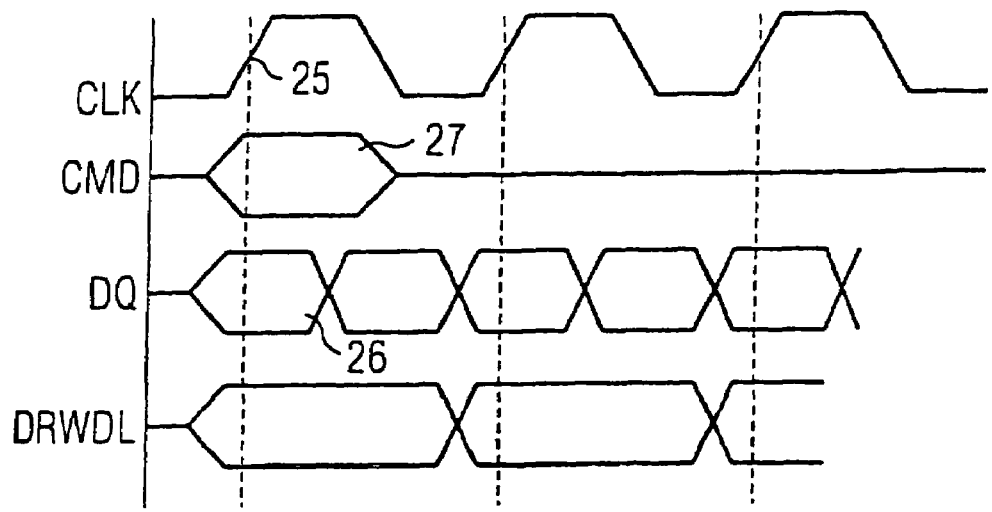
FIG. 2 is a signal diagram for signals occurring in the circuit configuration shown in FIG. 1 during the test mode.

In the test mode shown in FIG. 2, when the control signal TM is active, a write command 27, for example, is input by means of the command control signal CMD and is assessed on the rising edge 25 of the clock signal CLK. At the same time, a data bit 26 in the data signal DQ can be applied, since the DQ receiver 13 is controlled with the clock signal CLK via the multiplexer 14 and the connection 16. The output signal from the DQ receiver 13 is forwarded directly to the input of the logic device 19 and to the data line 22, bypassing the data latch 17 via the signal path 23 which connects the output of the demultiplexer 19 to one input of the multiplexer 20. On the rising edge 25 of the clock signal CLK, there is already a valid data value for the data signal DRWDL which is on the connection 22. As compared with the signal profile shown in FIG. 3 for the normal mode, the delay 35 comprising two clock periods of the operating clock signal CLK is saved. Instead, a data value which is input on the DQ pad 11 is available on the connection 22 in clock synchronism with the first rising edge of the operating clock signal CLK in the case of the invention. At the input of the semiconductor memory, the data signal DQ can therefore be provided in valid form as soon as a write command 27 is applied.

The multiplexers and demultiplexers 14, 19, 20 can be produced using transfer gates which are driven appropriately by the control signal TM.

In the event of write access during the test mode, it is thus possible to save up to two clock cycles. For a semiconductor memory having a storage capacity of 128 Mbits, a saving of up to 300 ms can be achieved for full writing to the memory cell array with certain access types. Since such write operations for the entire memory cell array are repeated relatively often within an individual test or in the overall test cycle, the invention results in a significant saving of test time.

I claim:

1. A circuit configuration for receiving a data signal, comprising:
    a first connection for receiving the data signal;
    a second connection for receiving a first clock signal;
    an input buffer connected downstream of said first connection in a signal flow direction, said input buffer having a clock input;
    a clock-controllable memory element connected downstream of said input buffer;
    an output connection connected downstream of said memory element for carrying the data signal;
    a third connection supplying a second clock signal;
    a first multiplexer having a first input receiving the first clock signal, a second input receiving the second clock signal from said third connection, and an output connected to said clock input of said input buffer, said first multiplexer selectively supplying the first clock signal, in a first setting, and the second clock signal, in a second setting, to said input buffer for clock control; and
    a switchable signal path connected to bypass said memory element when said first multiplexer is in the second setting, wherein said output connection is coupled to an output of said switchable signal path.

2. The circuit configuration according to claim 1, wherein said switchable signal path comprises a demultiplexer having an input connected to an output of said input buffer and an output connected to said memory element, and a further multiplexer having an input connected firstly to said memory element and secondly to an output of said demultiplexer.

3. The circuit configuration according to claim 2, wherein said first multiplexer, said further multiplexer, and said demultiplexer are each controllable by one control signal.

4. The circuit configuration according to claim 1, which comprises a further input connection via which the second clock signal is input.

5. The circuit configuration according to claim 4, which comprises circuit means generating a rising edge of the first clock signal with a delay of at least one clock period of the second clock signal after a rising edge of the second clock signal when a read command is produced during the rising edge of the second clock signal.

6. The circuit configuration according to claim 1, which comprises a memory cell array having memory cells for storing data values, and wherein said output connection is coupled to said memory cell array for receiving data values.

7. The circuit configuration according to claim 6, wherein the circuit configuration has a normal mode and a test mode, wherein a function test can be carried out during the test mode, and wherein the control signal is used for setting the test mode.

\* \* \* \* \*